United States Patent
Choi et al.

(10) Patent No.: US 9,601,720 B2
(45) Date of Patent: Mar. 21, 2017

(54) ORGANIC LIGHT EMITTING DIODE DISPLAY

(71) Applicant: SAMSUNG DISPLAY CO., LTD., Yongin-si, Gyeonggi-Do (KR)

(72) Inventors: Jin Woo Choi, Seoul (KR); Jae Ik Lim, Hwaseong-si (KR); Hae Yun Choi, Hwaseong-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/922,613

(22) Filed: Oct. 26, 2015

(65) Prior Publication Data

US 2016/0211487 A1    Jul. 21, 2016

(30) Foreign Application Priority Data

Jan. 20, 2015  (KR) ......................... 10-2015-0009416

(51) Int. Cl.
*H01L 51/52*  (2006.01)
*H01L 27/32*  (2006.01)

(52) U.S. Cl.
CPC ........ *H01L 51/5281* (2013.01); *H01L 27/326* (2013.01); *H01L 51/5284* (2013.01); *H01L 27/322* (2013.01); *H01L 27/3211* (2013.01); *H01L 51/5268* (2013.01)

(58) Field of Classification Search
CPC . H01L 51/5293; H01L 27/3211; H01L 27/322
See application file for complete search history.

(56) References Cited

U.S. PATENT DOCUMENTS

| 2014/0098078 | A1  | 4/2014 | Jeon et al.              |
| 2014/0138663 | A1* | 5/2014 | Aratani ........... H01L 51/0085 257/40 |
| 2015/0194443 | A1* | 7/2015 | Chen .............. H01L 27/1248 257/72 |
| 2015/0214280 | A1* | 7/2015 | Furuie ............ H01L 27/3218 257/89 |

FOREIGN PATENT DOCUMENTS

| JP | 2012-237882 A | 12/2012 |
| JP | 5470689 B2    | 4/2014  |
| KR | 10-2012-0122534 A | 11/2012 |

\* cited by examiner

*Primary Examiner* — Roy Potter
*Assistant Examiner* — Paul Patton
(74) *Attorney, Agent, or Firm* — Lee & Morse, P.C.

(57) ABSTRACT

An organic light emitting diode display includes a plurality of switches, a plurality of organic light emitting diodes respectively connected to the switches, and a polarization layer on the organic light emitting diodes. The polarization layer includes a light blocking area and a plurality of color filters. The light blocking area has a plurality of openings respectively exposing the organic light emitting diodes. The color filters respectively fill the openings. A first dot opening includes a first red opening, a first green opening, and a first blue opening elongated in a first direction. A second dot opening includes a second red opening, a second green opening, and a second blue opening elongated in a second direction crossing the first direction.

22 Claims, 10 Drawing Sheets

ORGANIC LIGHT EMITTING DIODE DISPLAY

CROSS-REFERENCE TO RELATED APPLICATION

Korean Patent Application No. 10-2015-0009416, filed on Jan. 20, 2015, and entitled, "Organic Light Emitting Diode Display," is incorporated by reference herein in its entirety.

BACKGROUND

1. Field

One or more embodiments relate to an organic light emitting diode display.

2. Description of the Related Art

An organic light emitting diode display uses a plurality of pixels to generate images. The organic light emitting diode of each pixel includes an organic light emitting layer between an anode and cathode. Electrons from the cathode and holes from the anode combine in the organic light emitting layer to form excitons. Light is emitted when the excitons change state.

One type of organic light emitting diode display uses a polarizer to reduce external light reflection. The polarizer increases the thickness of the display and decreases emission efficiency. Also, the polarizer may become damaged when used in a flexible display device.

Attempts have been made to overcome these drawbacks. For example, one attempt involves using a Pol-less structure having a light blocking member and a color filter. Such a structure may increase emission efficiency, reduce external light reflection, and may be useable in a flexible display device.

Also, in a Pol-less structure, a light trapping effect may increase as the width of the opening of the light blocking member decreases. Also, external light reflection may be reduced. However, when the width of the opening of the light blocking member is narrow, lateral luminance may deteriorate. As a result, the viewing angle of the display may be adversely affected.

SUMMARY

In accordance with one or more embodiments, an organic light emitting diode display includes a substrate; a switching element layer including a plurality of switches on the substrate; a plurality of organic light emitting diodes on the switching element layer and respectively connected to the switches; and a polarization layer on the organic light emitting diodes and including a light blocking area having a plurality of openings respectively exposing the organic light emitting diodes and a plurality of color filters respectively filling the openings, wherein a first dot opening includes a first red opening, a first green opening, and a first blue opening elongated in a first direction, and wherein a second dot opening includes a second red opening, a second green opening, and a second blue opening elongated in a second direction crossing the first direction.

The color filters may include a first dot color filter having a first red color filter, a first green color filter, and a first blue color filter respectively corresponding to the first red opening, the first green opening, and the first blue opening, and a second dot color filter having a second red color filter, a second green color filter, and a second blue color filter respectively corresponding to the second red opening, the second green opening, and the second blue opening, the color filters covering edges of the light blocking area adjacent to respective ones of the openings.

The first red opening, the first green opening, and the first blue opening may cross the second red opening, the second green opening, and the second blue opening, respectively. The first red opening, the first green opening, and the first blue opening of the first dot opening may be substantially parallel to a center line between the first dot opening and the second dot opening, and the second red opening, the second green opening, and the second blue opening of the second dot opening may be substantially perpendicular to the center line. The first red opening, the first green opening, and the first blue opening of the first dot opening and the second red opening, the second green opening, and the second blue opening of the second dot opening may be obliquely disposed with reference to a center line between the first dot openings.

The organic light emitting diodes may include a plurality of pixel electrodes on the switching element layer, a plurality of organic emission layers on respective ones of the pixel electrodes, and a common electrode on the organic emission layers, and a connection part of the pixel electrodes respectively connected to the switches elements includes a red connection part of the red pixel electrode, a green connection part of the green pixel electrode, and a blue connection part of the blue pixel electrode.

The red pixel electrode may include a first red pixel electrode and a second red pixel electrode respectively corresponding to the first red opening and the second red opening, the green pixel electrode may include a first green pixel electrode and a second green pixel electrode respectively corresponding to the first green opening and the second green opening, the blue pixel electrode may include a first blue pixel electrode and a second blue pixel electrode respectively corresponding to the first blue opening and the second blue opening, the switches may include a first red switch and a second red switch respectively connected to the first red pixel electrode and the second red pixel electrode, a first green switch and a second green switch respectively connected to the first green pixel electrode and the second green pixel electrode, and a first blue switch and a second blue switch respectively connected to the first blue pixel electrode and the second blue pixel electrode.

The red connection part, the green connection part, and the blue connection part may be substantially on a same horizontal line or a same vertical line. The horizontal line connecting the first red connection part of the first red pixel electrode, the first green connection part of the first green pixel electrode, and the first blue connection part of the first blue pixel electrode may cross the vertical line connecting the second red connection part of the second red pixel electrode, the second green connection part of the second green pixel electrode, and the second blue connection part of the second blue pixel electrode.

The first red switch and the second red switch may cross each other, the first green switch and the second green switch may cross each other, and the first blue switch and the second blue switch may cross each other. The red connection part, the green connection part, and the blue connection part may be substantially on a same oblique line. The oblique line may include a first oblique line connects a first red connection part of the first red pixel electrode, a first green connection part of the first green pixel electrode, and a first blue connection part of the first blue pixel electrode, a second oblique line connects a second red connection part of the second red pixel electrode, a second green connection part of the second green pixel electrode, and a second blue connection part of the second blue pixel electrode, and the first oblique line is substantially parallel to the second oblique line.

The first red switch may be substantially parallel to the second red switch, the first green switch may be substantially parallel to the second green switch, and the first blue switch may be substantially parallel to the second blue switch. The pixel electrodes may include a first dot electrode including the first red pixel electrode, the first green pixel electrode, and the first blue pixel electrode, and a second dot electrode including the second red pixel electrode, the second green pixel electrode, and the second blue pixel electrode.

The first red pixel electrode, the first green pixel electrode, and the first blue pixel electrode may be sequentially disposed from a first side to a second side, and the second red pixel electrode, the second green pixel electrode, and the second blue pixel electrode may be sequentially disposed from a third side to a fourth side.

The display may include an encapsulation layer on the organic light emitting diodes; and a scattering layer between the encapsulation layer and the polarization layer. The display may include a plurality of the first dot openings and a plurality of the second dot openings alternatively disposed with the first dot openings.

In accordance with one or more other embodiments, an organic light emitting diode display includes a first dot opening; a second dot opening; a plurality of color filters; a plurality of organic light emitting diodes; a light blocking area over the organic light emitting diodes, wherein the light blocking area includes a plurality of openings respectively corresponding to the organic light emitting diodes, wherein the color filters respectively fill the openings, wherein the first dot opening includes a first red opening, a first green opening, and a first blue opening elongated in a first direction, and wherein the second dot opening includes a second red opening, a second green opening, and a second blue opening elongated in a second direction crossing the first direction.

The light blocking area may block light passing through the color filters and reflected from corresponding ones of the organic light emitting diodes. The display may include a first dot color filter having a first red color filter, a first green color filter, and a first blue color filter respectively corresponding to the first red opening, the first green opening, and the first blue opening, and a second dot color filter having a second red color filter, a second green color filter, and a second blue color filter respectively corresponding to the second red opening, the second green opening, and the second blue opening.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
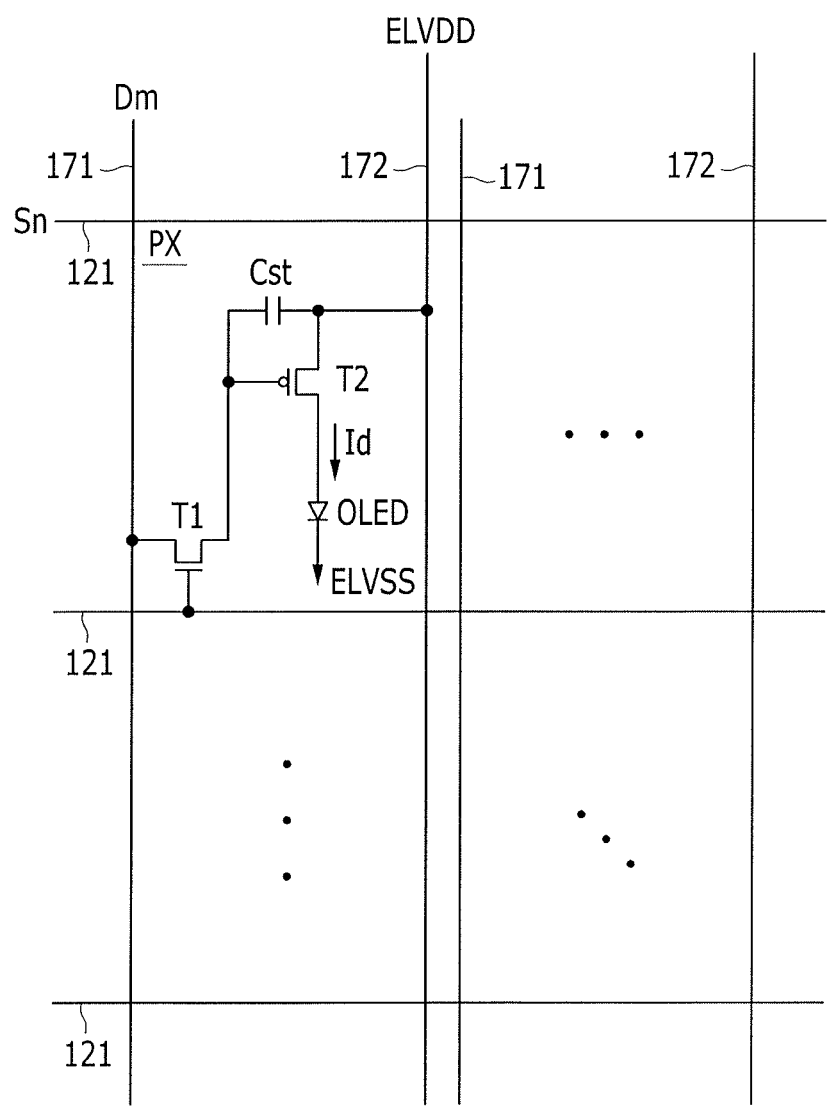
FIG. 1 illustrates an embodiment of a pixel of an organic light emitting diode display according.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Further, in the accompany drawings, an active matrix (AM) type of organic light emitting diode display having a 2Tr-1 Cap structure in which two thin film transistors (TFTs) and one capacitor are included in one pixel is illustrated. In another embodiment, the organic light emitting diode display may include three or more TFTs and two or more capacitors in one pixel, and may also be formed to have various structures in which separate wiring is further formed. Also, a pixel may be understood to correspond to a minimum unit for displaying light of an image, and the organic light emitting diode display displays an image through a plurality of pixels.

FIG. 1 illustrates an embodiment of pixel of an organic light emitting diode display. Referring to FIG. 1, the organic light emitting diode display includes a plurality of signal lines and a plurality of pixels PX arranged in a matrix and connected to the signal lines. The signal lines include a plurality of scan lines 121 for transmitting a scan signal Sn, a plurality of data lines 171 crossing the scan lines 121 for transmitting a data signal Dm, and a plurality of driving voltage lines 172 for transmitting a driving voltage ELVDD. The scan lines 121 extend in a first (e.g., row) direction and may be substantially parallel with each other. The data lines 171 and the driving voltage lines 172 extend in a second (e.g., column) direction and may be substantially parallel with each other.

Each pixel PX includes a plurality of transistors connected to the signal lines 121, 171, and 172, a storage capacitor, Cst, and an organic light emitting diode (OLED). The transistors include a switching transistor T1 connected to the data line 171 and a driving transistor T2 connected to the organic light emitting diode (OLED).

The switching thin film transistor T1 includes a control terminal, an input terminal, and an output terminal. The control terminal is connected to the scan line 121, the input terminal is connected to the data line 171, and the output terminal is connected to the driving thin film transistor T2. The switching thin film transistor T1 transmits a data signal from data line 171 to the driving thin film transistor T2 based on a scan signal from the scan line 121.

The driving thin film transistor T2 includes a control terminal, an input terminal, and an output terminal. The control terminal is connected to the switching thin film transistor T1, the input terminal is connected to the driving voltage line 172, and the output terminal is connected to the organic light emitting diode OLED. The driving thin film transistor T2 allows an output current Id to flow having a magnitude that varies according to a voltage applied between the control terminal and the output terminal.

The storage capacitor Cst is connected between the control terminal and the input terminal of the driving thin film transistor T2. The storage capacitor Cst charges a data signal applied to the control terminal of the driving thin film transistor T2, and maintains charging of the data signal after switching thin film transistor T1 is turned off.

The organic light emitting diode OLED includes an anode connected to the output terminal of the driving thin film transistor T2, a cathode connected to a common voltage ELVSS, and an organic light emitting member formed between the anode and the cathode. The organic light emitting diode OLED displays light of an image having an intensity based on the output current Id of the driving thin film transistor T2.

The switching thin film transistor T1 and the driving thin film transistor T2 may be n-channel field effect transistors (FETs) or p-channel FETs. In addition, a connection relationship between the thin film transistors T1 and T2, the storage capacitor Cst, and the organic light emitting diode OLED may be different in another embodiments, and/or the numbers of transistors and/or capacitors may be different.

Figure 2:
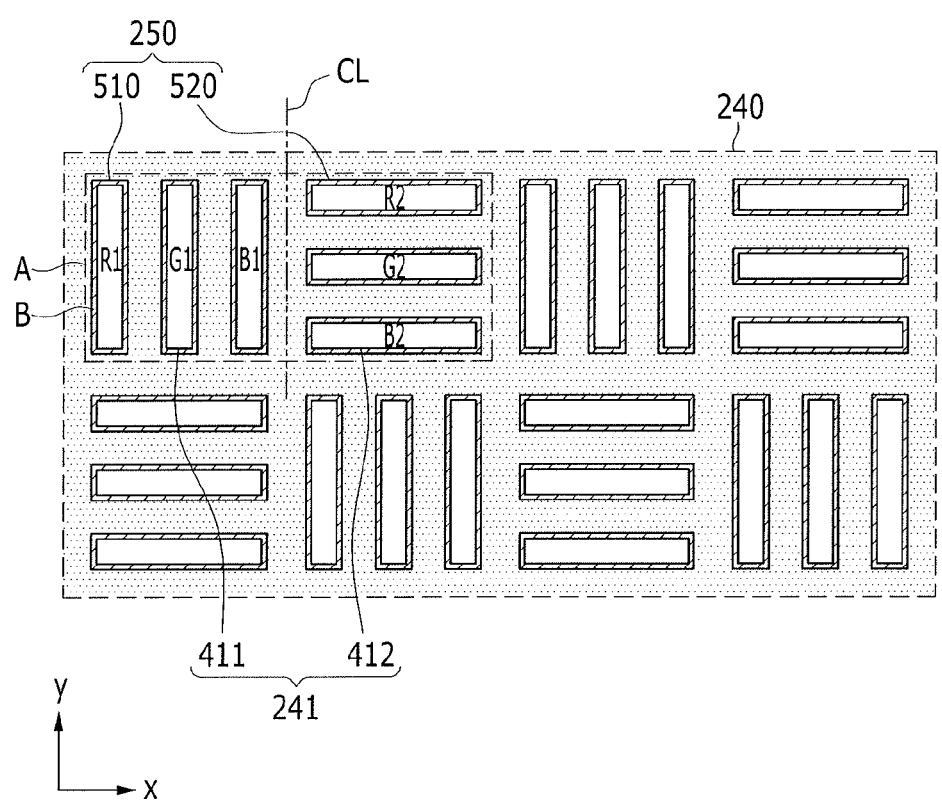
FIG. 2 illustrates a top plan view of the organic light emitting diode display.
Figure 3:
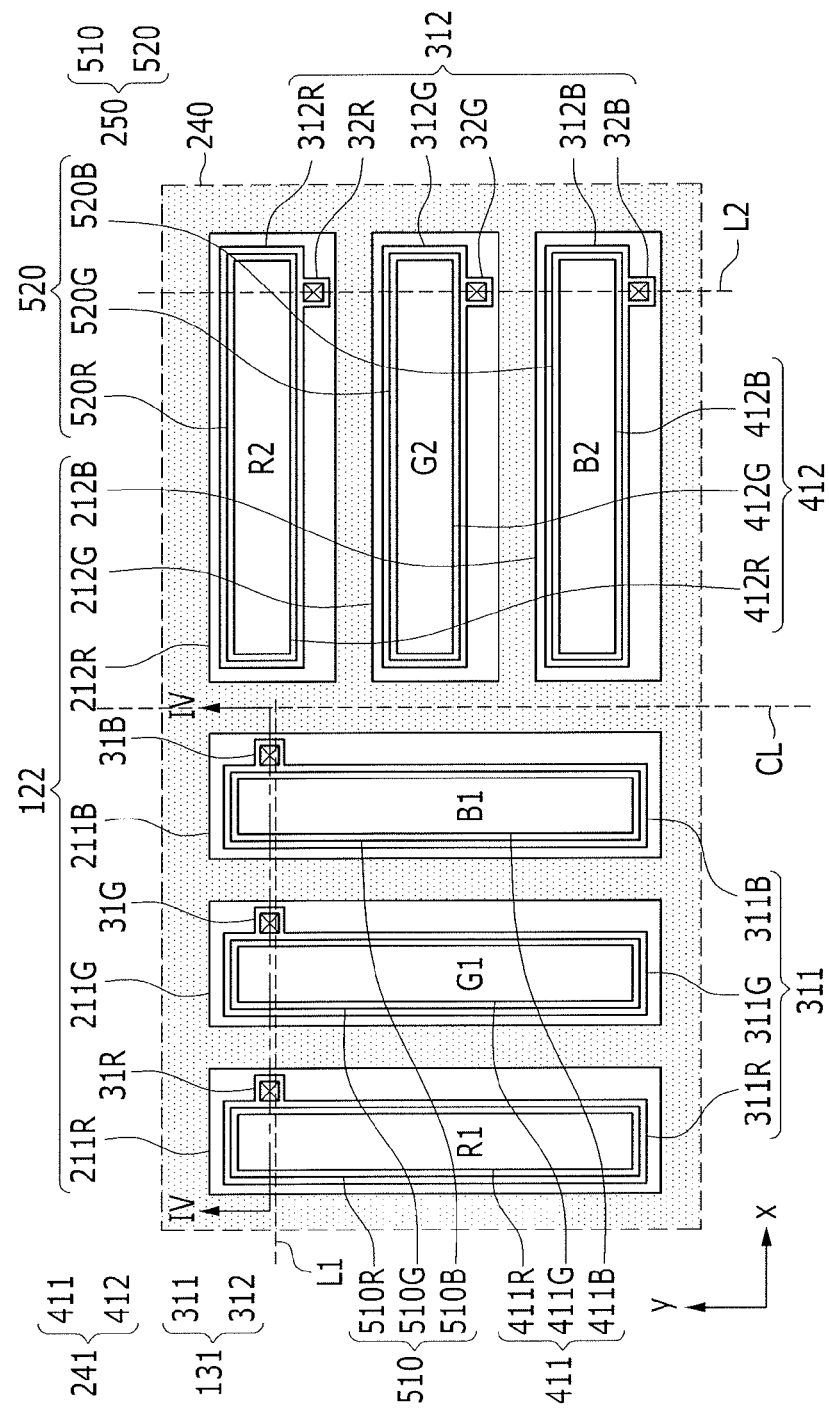
FIG. 3 illustrates an enlarged layout view of portion A in FIG. 2.
Figure 4:
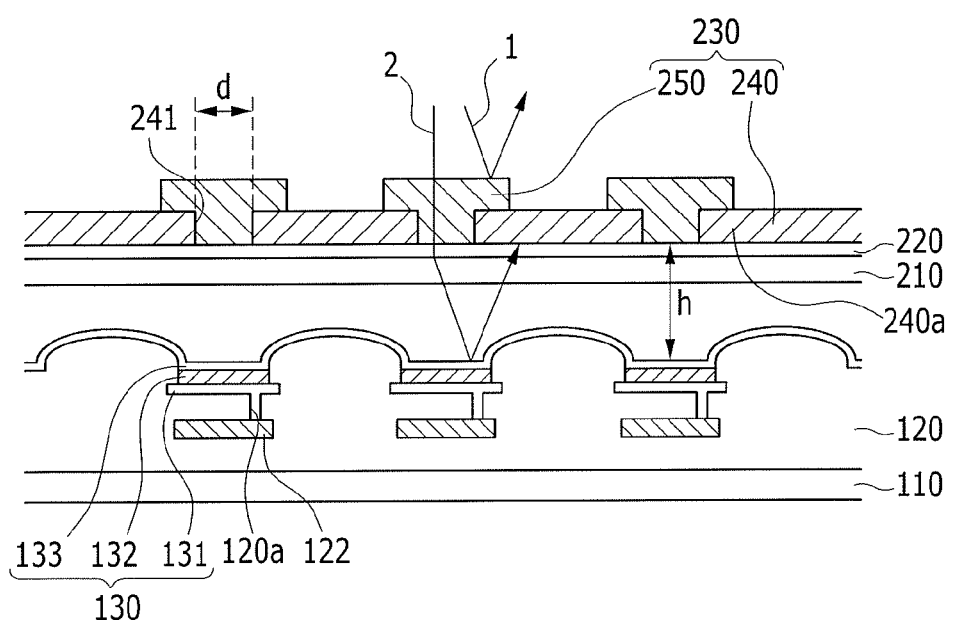
FIG. 4 illustrates a cross-sectional view taken along line IV-IV in FIG. 3.

FIG. 2 illustrates an embodiment of a top plan view of the organic light emitting diode display. FIG. 3 is an enlarged layout view of portion A of FIG. 2. FIG. 4 illustrates an embodiment of a cross-sectional view taken along a line IV-IV in FIG. 3.

Referring to FIGS. 2 to 4, a switching element layer 120 including a plurality of signal lines and a plurality of switching elements 122, including a plurality of switching thin film transistors and driving thin film transistors, is formed on a substrate 110 made, for example, of transparent glass or plastic. The switching element layer 120 may include a plurality of thin films covering the switching elements 122 to be insulated.

A plurality of organic light emitting diodes 130 are formed on the switching element layer 120. The organic light emitting diodes 130 are respectively connected to the switching elements 122.

The organic light emitting diodes 130 include a plurality of pixel electrodes 131 formed on the switching element layer 120, a plurality of organic emission layers 132 respectively formed on a plurality of pixel electrodes 131, and a common electrode 133 formed on the plurality of organic emission layers 132. In a top-emission type structure, the pixel electrode 131 may include metal having high reflectance such as silver (Ag) or aluminum (Al), or alloys thereof. The common electrode 133 may include a transparent conductive oxide to transmit the light such as ITO (indium tin oxide) or IZO (indium zinc oxide). The organic emission layer 132 may include organic layers to efficiently transmit carries of holes or electrons to the emission layer as well as the emission layer. The organic layers may include a hole injection layer and a hole transferring layer between the pixel electrode 131 and the organic emission layer 132. An electron injection layer and an electron transferring layer may be between the common electrode 133 and the organic emission layer 132.

As shown in FIGS. 3 and 4, the pixel electrodes 131 include a first dot electrode 311 and a second dot electrode 312 alternately disposed, e.g., a plurality of first dot electrodes 311 and second dot electrodes 312 may be alternatively disposed along a same row and/or column in the display. The first dot electrode 311 may include a first red pixel electrode 311R formed in a first red pixel R1, a first green pixel electrode 311G formed in a first green pixel G1, and a first blue pixel electrode 311B formed in a first blue pixel B1. The second dot electrode 312 may include a second red pixel electrode 312R formed in a second red pixel R2, a second green pixel electrode 312G formed in a second green pixel G2, and a second blue pixel electrode 312B formed in a second blue pixel B2. The first red pixel electrode 311R, the first green pixel electrode 311G, and the first blue pixel electrode 311B are sequentially disposed from a first (e.g., left) side to a second (e.g., right) side. The second red pixel electrode 312R the second green pixel electrode 312G, and the second blue pixel electrode 312B are sequentially disposed from a third (e.g., upper) side to a fourth (e.g., lower) side.

The switching elements 122 include a first red switching element 211R and a second red switching element 212R respectively connected to the first red pixel electrode 311R and the second red pixel electrode 312R, a first green switching element 211G and a second green switching element 212G respectively connected to the first green pixel electrode 311G and the second green pixel electrode 312G, and a first blue switching element 211B and a second blue switching element 212B respectively connected to the first blue pixel electrode 311B and the second blue pixel electrode 312B.

The pixel electrodes 131 include connection parts 31R, 31G, 31B, 32R, 32G, and 32B respectively connected to the switching elements 122. The connection parts 31R, 31G, 31B, 32R, 32G, and 32B of the pixel electrode 131 are connected to the switching element 122 through a contact hole 120a in the switching element layer 120.

The connection parts 31R, 31G, 31B, 32R, 32G, and 32B include the red connection parts 31R and 32R of the red pixel electrodes 311R and 312R, the green connection parts 31G and 32G of the green pixel electrodes 311G and 312G, and the blue connection parts 31B and 32B of the blue pixel electrodes 311B and 312B. The red connection parts 31R and 32R, the green connection parts 31G and 32G, and the blue connection parts 31B and 32B are substantially positioned on the same imaginary horizontal line L1 or imaginary vertical line L2.

For example, the first red connection part 31R of the first red pixel electrode 311R, the first green connection part 31G of the first green pixel electrode 311G, and the first blue connection part 31B of the first blue pixel electrode 311B are positioned on the imaginary horizontal line L1 connecting them. The second red connection part 32R of the second red pixel electrode 312R, the second green connection part 32G of the second green pixel electrode 312G, and the second blue connection part 32B of the and second blue pixel electrode 312B are positioned on the imaginary vertical line L2 connecting them. The imaginary horizontal line L1 may cross the imaginary vertical line L2 when extended.

The first red switching element 211R, the first green switching element 211G, and the first blue switching element 211B are elongated in a first direction y. The second red switching element 212R, the second green switching element 212G, and the second blue switching element 212B are elongated in a second direction x. The first red switching element 211R and the second red switching element 212R cross each other. The first green switching element 211G and the second green switching element 212G cross each other. The first blue switching element 211B and the second blue switching element 212B cross each other.

An encapsulation layer 210 may be formed on the organic light emitting diodes 130 to protect the organic light emitting diode 130 from external moisture. The encapsulation layer 210 may include a thin film encapsulation which include, for example, glass or an organic layer and an inorganic layer alternately deposited.

A scattering layer 220 is formed on the encapsulation layer 210 to scatter incident external light. A polarization layer 230 is formed on the scattering layer 220 to eliminate external light reflection. The scattering layer 220 may have a lens shape or may be formed of a scattering member. The polarization layer 230 includes a light blocking member 240 having a plurality of openings 241 exposing a plurality of organic light emitting diodes 130 and a plurality of color filters 250 filling the openings.

The polarization layer 230 does not reflect light of a wavelength corresponding to a color of the color filter 250 when external light 1 is reflected in the color filter 250. Accordingly, external light reflection may be reduced or minimized. In this case, a resonance structure may be provided for light of a wavelength corresponding to the color emitted from the organic light emitting diode 130. The light may be passed unaltered through the color filter 250. This resonance structure may be realized by controlling a resonance interval h between the organic light emitting diode 130 and the color filter 250. In another embodiment, the resonance structure may be realized by using a resonance thin film.

The scattering layer 220 refracts external light 2 incident to the color filter 250 and reflected by the organic light emitting diode 130. The reflected light is directed toward the light blocking member 240. The light blocking member 240 blocks the reflected light, preventing the light from being reflected to the outside. The scattering layer 220 reflects the external light that is vertically incident to the color filter 250 so that the light is blocked in the light blocking member 240. This may further reduce or minimize reflectance of the external light. Accordingly, contrast ratio may be improved.

The plurality of openings 241 in the light blocking member 240 include a first dot opening 411 and a second dot opening 412 that are alternately disposed, e.g., a plurality of dot openings 411 and second dot openings 412 may be alternately disposed along a same row and/or column in the display. The first dot opening 411 includes a first red opening 411R, a first green opening 411G, and a first blue opening 411B elongated in the first direction y. The first red opening 411R, the first green opening 411G, and the first blue opening 411B are separated from each other by a predetermined interval. The second dot opening 412 includes a second red opening 412R, a second green opening 412G, and a second blue opening 412B elongated in the second direction crossing the first direction y. The second red opening 412R, the second green opening 412G, and the second blue opening 412B are separated from each other by a predetermined interval.

The first red pixel electrode 311R, the first green pixel electrode 311G, and the first blue pixel electrode 311B are downwardly disposed respectively corresponding to the first red opening 411R, the first green opening 411G, and the first blue opening 411B. The second red pixel electrode 312R, the second green pixel electrode 312G, and the second blue pixel electrode 312B are downwardly disposed respectively corresponding to the second red opening 412R, the second green opening 412G, and the second blue opening 412B.

In this case, the first red opening 411R, the first green opening 411G, and the first blue opening 411B cross the second red opening 412R, the second green opening 412G, and the second blue opening 412B, respectively.

For example, the first red opening 411R, the first green opening 411G, and the first blue opening 411B of the first dot opening 411 are parallel to the imaginary center line CL between the first dot opening 411 and the second dot opening 412. The second red opening 412R, the second green opening 412G, and the second blue opening 412B of the second dot opening 412 are perpendicular to the center line CL.

The color filters 250 include a first dot color filter 510 and a second dot color filter 520 that are alternately disposed. The first dot color filter 510 includes a first red color filter 510R, a first green color filter 520G, and a first blue color filter 520B positioned respectively corresponding to the first red opening 411R, the first green opening 411G, and the first blue opening 411B. The second dot color filter 520 includes a second red color filter 520R, a second green color filter 520G, and a second blue color filter 520B positioned respectively corresponding to the second red opening 412R, the second green opening 412G, and the second blue opening 412B.

The color filter 250 covers an edge 240a adjacent to the opening 241 of the light blocking member 240, such that the edge 240a of the light blocking member 240 overlaps the color filter 250. Accordingly, when a width d of the opening 241 is narrow, a shadow region B is generated in which light emitted from the organic light emitting diode 130 is partially blocked at the edge 240a of the light blocking member 240. As a result, lateral luminance in the direction of the shadow region B deteriorates. Accordingly, the viewing angle of the direction in which the shadow region B is generated deteriorates.

To prevent this, an organic light emitting diode display according to an exemplary embodiment alternately disposes the first dot opening 411 elongated in the first direction y and the second dot opening 412 elongated in the second direction z crossing the first direction y. Thus, the shadow region B is uniformly dispersed, thereby having the same lateral luminance in all directions. Accordingly, the viewing angle may be improved by preventing deterioration of the viewing in a predetermined direction.

Figure 5:
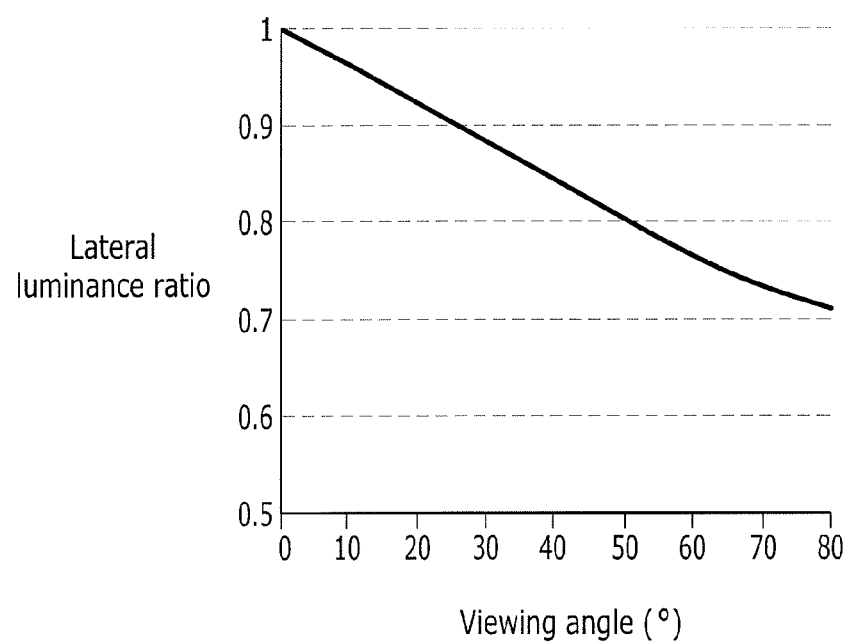
FIG. 5 illustrates a lateral luminance ratio for a horizontal direction viewing angle for one type of organic light emitting diode display that has been proposed.
Figure 6:
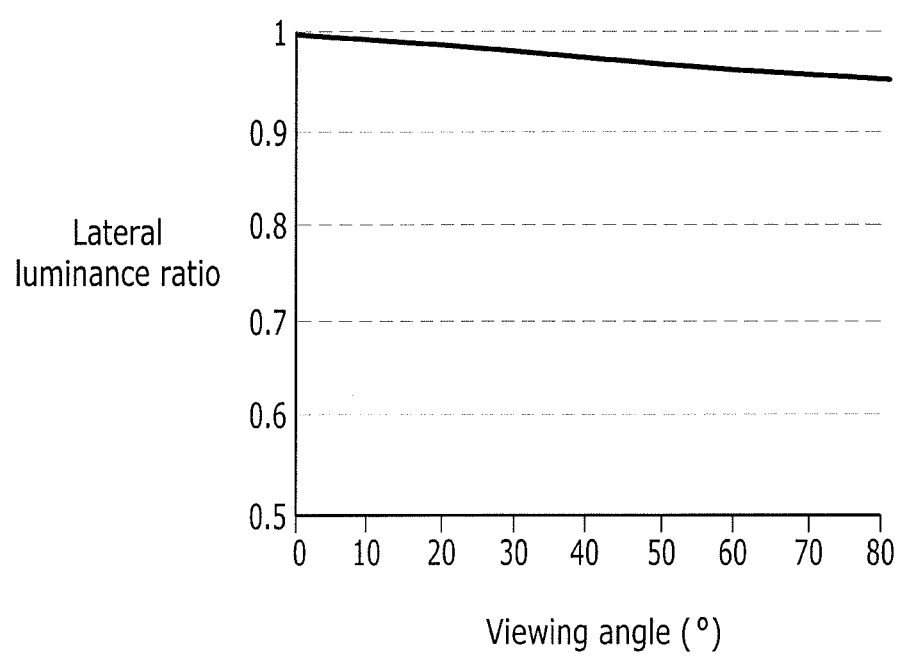
FIG. 6 illustrates a lateral luminance ratio for a vertical direction viewing angle of the proposed organic light emitting diode display.
Figure 7:
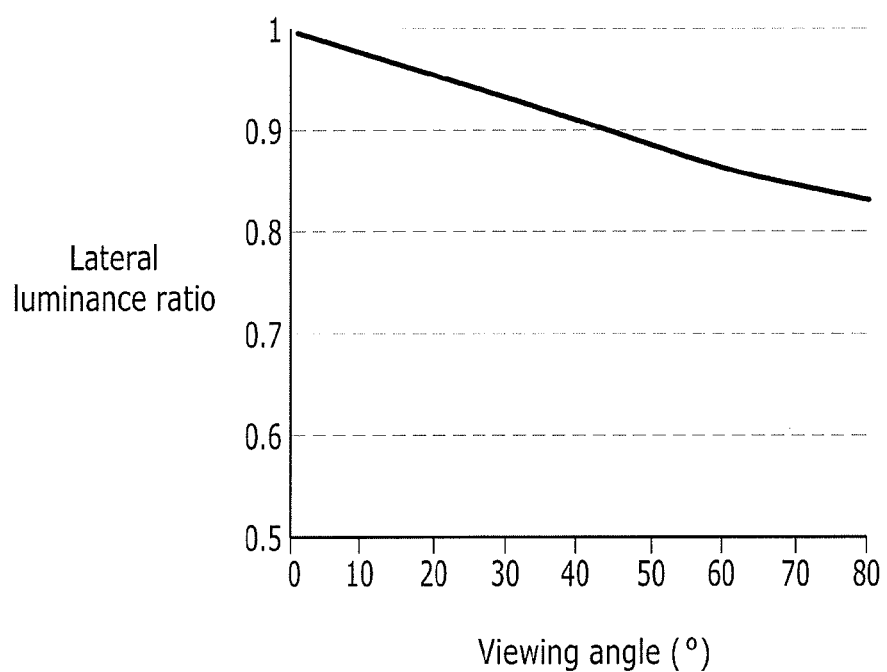
FIG. 7 illustrates an example of a lateral luminance ratio for a horizontal direction viewing angle of one embodiment of an organic light emitting diode display.
Figure 8:
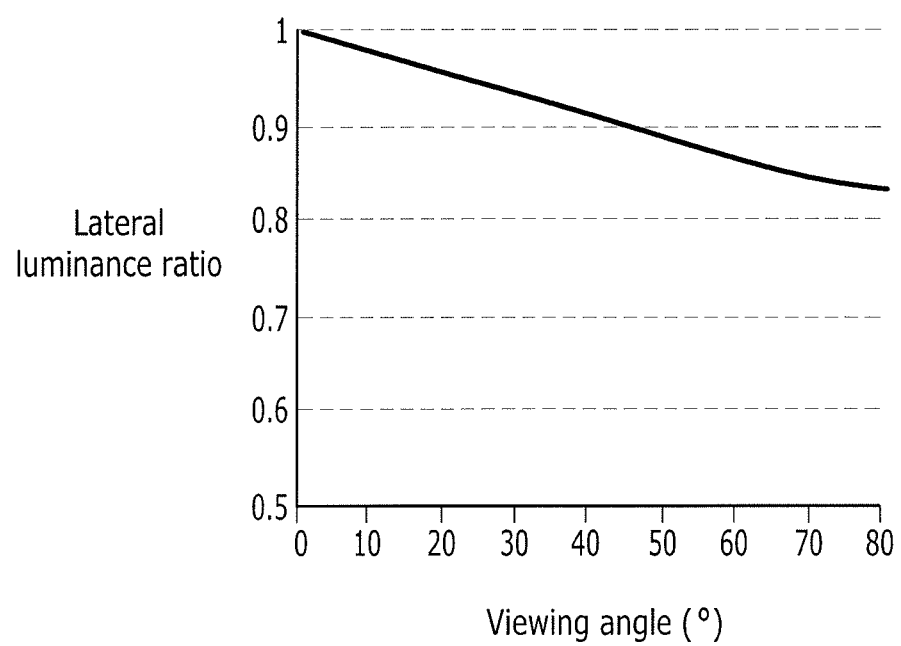
FIG. 8 illustrates an example of a lateral luminance ratio for a vertical direction viewing angle of one embodiment of an organic light emitting diode display.

FIG. 5 is a graph illustrating a lateral luminance ratio for a horizontal direction viewing angle of a comparative example of an organic light emitting diode display. FIG. 6 is a graph illustrating a lateral luminance ratio for a vertical direction viewing angle of the comparative example of the organic light emitting diode display. FIG. 7 is a graph illustrating an example of a lateral luminance ratio for a horizontal direction viewing angle of an embodiment of an organic light emitting diode display. FIG. 8 is a graph illustrating an example of a lateral luminance ratio for a vertical direction viewing angle of an embodiment of organic light emitting diode display.

As illustrated in FIGS. 5 and 6, in the organic light emitting diode display of the comparative example, the first dot opening 411 and the second dot opening 412 are alternately disposed and elongated in the first (vertical) direction y. Also, the lateral luminance ratio for the horizontal direction viewing angle is largely decreased as viewing angle is increased. However, the decreasing width of the lateral luminance for the vertical direction viewing angle is small even though the viewing angle is increased.

This is because the light blocking member 240 having the first dot opening 411 and the second dot opening 412 elongated in the vertical direction y forms the shadow region B elongated in the vertical direction y. As a result, lateral luminance may be largely decreased as viewing angle increases. The shadow region B may be shortly formed in the second (horizontal) direction x in the light blocking member 240. As a result, lateral luminance is not largely decreased although viewing angle is increased.

However, as illustrated in FIGS. 7 and 8, in the organic light emitting diode display according to one exemplary embodiment, the first dot opening 411 and the second dot opening 412 are alternately disposed and respectively elongated in the vertical direction y and the horizontal direction x. Thus, the shadow region B is uniformly dispersed so the same lateral luminance exists in all directions. As a result, viewing angle is increased for the lateral luminance ratio for the horizontal direction viewing angle and the lateral luminance ratio for the vertical direction viewing angle. The decreasing width of the lateral luminance ratio may therefore be small.

In one exemplary embodiment, the first dot opening and the second dot opening are parallel or perpendicular to the center line with respect to the imaginary center line. However, the first dot opening and the second dot opening may be oblique with respect to the imaginary center line in another exemplary embodiment.

Figure 9:
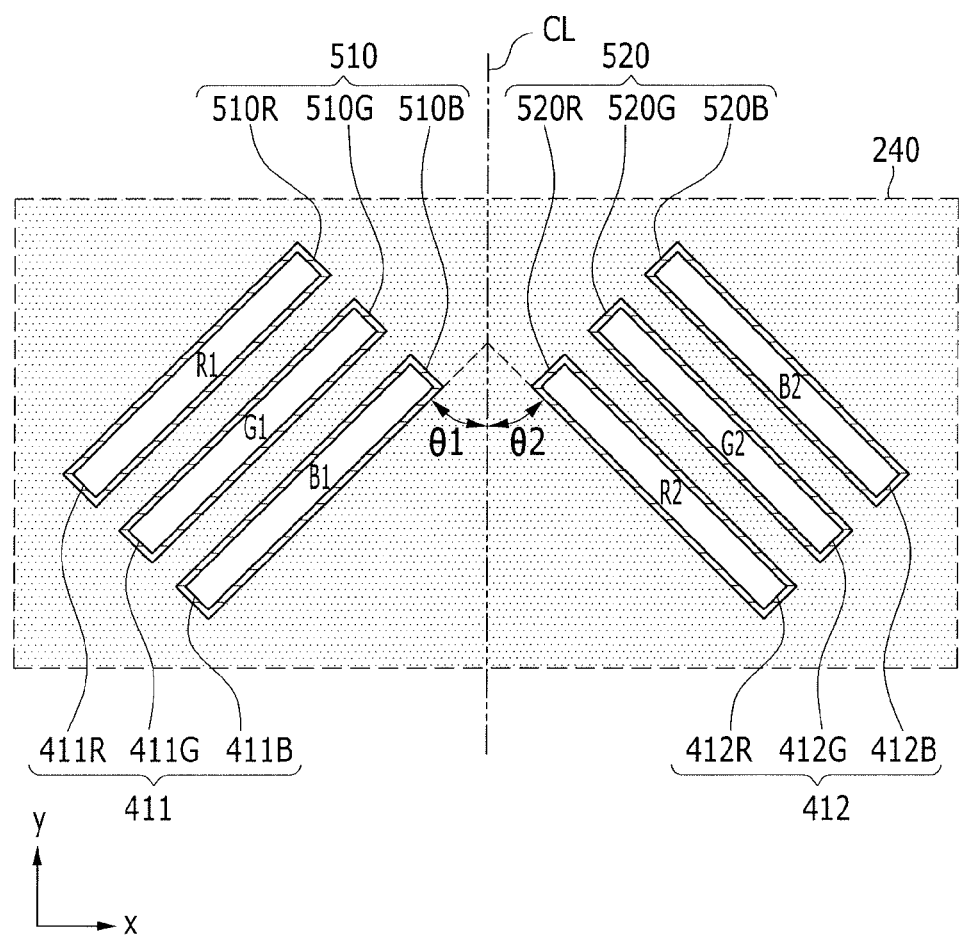
FIG. 9 illustrates another embodiment of an organic light emitting diode display.

FIG. 9 is a top plan view illustrating another embodiment of an organic light emitting diode display. The embodiment in FIG. 9 is substantially the same as the embodiment in FIGS. 2, 3, and 4, except that the first dot opening and the second dot opening are obliquely disposed with respect to the imaginary center line.

As illustrated in FIG. 9, in the organic light emitting diode display, the first red opening 411R, the first green opening 411G, and the first blue opening 411B cross the second red opening 412R, the second green opening 412G, and the second blue opening 412B, respectively. The first red opening 411R, the first green opening 411G, and the first blue opening 411B of the first dot opening 411 are inclined with respect to the imaginary center line CL between the first dot opening 411 and the second dot opening 412 while having a first inclination angle θ1 by the center line CL. The second red opening 412R, the second green opening 412G, and the second blue opening 412B of the second dot opening 412 are inclined with respect to the center line, while having a second inclination angle θ2. The first inclination angle θ1 and the second inclination angle θ2 may have the same magnitude in different directions with respect to the center line CL, or the inclination angles may be different in another embodiment.

When the first dot opening 411 and the second dot opening 412 face each other, the shadow region B generated in the edge 240a of the light blocking member 240 may be uniformly dispersed in all directions. Accordingly, the same lateral luminance may be formed in all directions to reduce or prevent deterioration of the viewing angle in any direction. The overlap viewing angle may therefore be improved.

On the other hand, in the exemplary embodiment, the red connection part, the green connection part, and the blue connection part are on substantially the same imaginary horizontal line or vertical line. In another embodiment, the red connection part, the green connection part, and the blue connection part may be on substantially the same imaginary oblique line.

Figure 10:
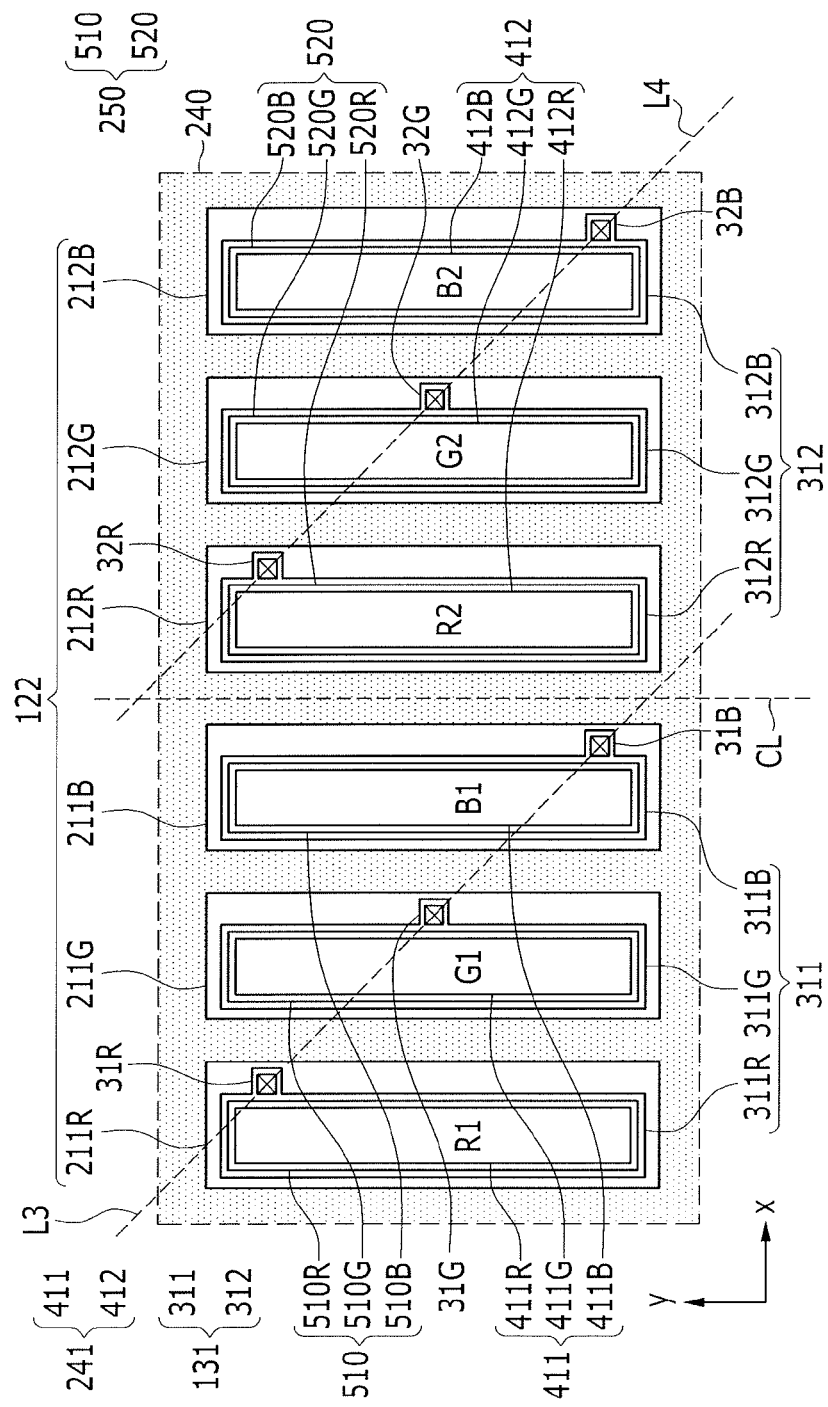
FIG. 10 illustrates another embodiment of an organic light emitting diode display.

FIG. 10 is a top plan view of another embodiment of an organic light emitting diode display. The exemplary embodiment in FIG. 10 is substantially the same as the exemplary embodiment in FIGS. 2, 3, and 4, except for the red connection part, the green connection part, and the blue connection part that are positioned substantially on the same imaginary oblique line.

As illustrated in FIG. 10, in the organic light emitting diode display, the red connection parts 31R and 32R, the green connection parts 31G and 32G, and the blue connection parts 31B and 32B are positioned on substantially the same imaginary oblique lines L3 and L4.

The imaginary oblique lines L3 and L4 include an imaginary first oblique line L3 and an imaginary second oblique line L4 that are substantially parallel to each other. The imaginary first oblique line L3 connects the first red connection part 31R of the first red pixel electrode 311R, the first green connection part 31G of the first green pixel electrode 311G, and the first blue connection part 31B of the first blue pixel electrode 311B to each other. The imaginary second oblique line L4 connects the second red connection part 32R of the second red pixel electrode 312R, the second green connection part 32G of the second green pixel electrode 312G, and the second blue connection part 32B of the second blue pixel electrode 312B to each other.

The first red switching element 211R and the second red switching element 212R are substantially parallel to each other. The first green switching element 211G and the second green switching element 212G are substantially parallel to each other. The first blue switching element 211B and the second blue switching element 212B are substantially parallel to each other.

As described above, when the first dot opening 411 and the second dot opening 412 that cross each other are alternately disposed (e.g., by disposing the red connection parts 31R and 32R, the green connection parts 31G and 32G, and the blue connection parts 31B and 32B on substantially the same imaginary oblique lines L3 and L4), all switching elements 211R, 211G, 211B, 212R, 212G, and 212B may be disposed in the same first direction y. Accordingly, the switching elements may be easily formed to be close, thereby realizing high resolution.

By way of summation and review, one type of organic light emitting diode display uses a polarizer to reduce external light reflection. The polarizer increases the thickness of the display and decreases emission efficiency. Also, the polarizer may become damaged when used in a flexible display device.

Attempts have been made to overcome these drawbacks. For example, one attempt involves using a Pol-less structure having a light blocking member and a color filter. Such a structure may increase emission efficiency, reduce external light reflection, and may be useable in a flexible display device. Also, in a Pol-less structure, a light trapping effect may increase as the width of the opening of the light blocking member decreases. Also, external light reflection may be reduced. However, when the width of the opening of the light blocking member is narrow, lateral luminance may deteriorate. As a result, the viewing angle of the display may be adversely affected.

In accordance with one or more embodiments, the first dot opening elongated in the first direction and the second dot opening elongated in the second direction and crossing the first direction are alternately disposed. As a result, the shadow region B is uniformly dispersed so that the same lateral luminance may be formed in all directions. Accordingly, viewing angle deterioration is reduced or eliminated in any direction, thereby improving the viewing angle. Also, by forming a scattering layer under the light blocking member, the external light incident vertically is blocked, so that external light reflection may be reduced or minimized and contrast ratio may be improved.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. An organic light emitting diode display, comprising:
   a substrate;
   a switching element layer including a plurality of switches on the substrate;
   a plurality of organic light emitting diodes on the switching element layer and respectively connected to the switches; and
   a polarization layer on the organic light emitting diodes and including a light blocking layer having a plurality of openings respectively exposing the organic light emitting diodes and a plurality of color filters respectively filling the openings, wherein a first dot opening includes a first red opening, a first green opening, and a first blue opening elongated in a first direction, and wherein a second dot opening includes a second red opening, a second green opening, and a second blue opening elongated in a second direction crossing the first direction, wherein
   the plurality of organic light emitting diodes emit red light, green light and blue light respectively, and wherein a resonance structure is disposed between the plurality of organic light emitting diodes and the plurality of color filters.

2. The display as claimed in claim 1, wherein the color filters include:
   a first dot color filter having a first red color filter, a first green color filter, and a first blue color filter respectively corresponding to the first red opening, the first green opening, and the first blue opening, and
   a second dot color filter having a second red color filter, a second green color filter, and a second blue color filter respectively corresponding to the second red opening, the second green opening, and the second blue opening, the color filters covering edges of the light blocking layer adjacent to respective ones of the openings.

3. The display as claimed in claim 1, wherein:
   the first red opening, the first green opening, and the first blue opening have short sides and long sides, and the second red opening, the second green opening, and the second blue opening have short sides and long sides, wherein
   the short sides of the first red opening, the first green opening, and the first blue opening face one of the long sides of the second red opening, the second green opening, and the second blue opening.

4. The display as claimed in claim 1, wherein:
   the first red opening, the first green opening, and the first blue opening of the first dot opening are substantially parallel to a center line between the first dot opening and the second dot opening, and
   the second red opening, the second green opening, and the second blue opening of the second dot opening are substantially perpendicular to the center line.

5. The display as claimed in claim 1, wherein:
   the first red opening, the first green opening, and the first blue opening of the first dot opening and the second red opening, the second green opening, and the second blue opening of the second dot opening are obliquely disposed with reference to a center line between a plurality of the first dot openings.

6. The display as claimed in claim 1, wherein:
   the organic light emitting diodes include a plurality of pixel electrodes on the switching element layer, a plurality of organic emission layers on respective ones of the pixel electrodes, and a common electrode on the organic emission layers, and
   a connection part of the pixel electrodes respectively connected to the switches includes a red connection part of a red pixel electrode, a green connection part of a green pixel electrode, and a blue connection part of a blue pixel electrode.

7. The display as claimed in claim 6, wherein:
   the red pixel electrode includes a first red pixel electrode and a second red pixel electrode respectively corresponding to the first red opening and the second red opening,
   the green pixel electrode includes a first green pixel electrode and a second green pixel electrode respectively corresponding to the first green opening and the second green opening,
   the blue pixel electrode includes a first blue pixel electrode and a second blue pixel electrode respectively corresponding to the first blue opening and the second blue opening,
   the switches include a first red switch and a second red switch respectively connected to the first red pixel electrode and the second red pixel electrode,
   a first green switch and a second green switch respectively connected to the first green pixel electrode and the second green pixel electrode, and
   a first blue switch and a second blue switch respectively connected to the first blue pixel electrode and the second blue pixel electrode.

8. The display as claimed in claim 7, wherein the red connection part, the green connection part, and the blue connection part are substantially on a same horizontal line or a same vertical line.

9. The display as claimed in claim 8, wherein the horizontal line connecting a first red connection part of the first red pixel electrode, a first green connection part of the first green pixel electrode, and a first blue connection part of the first blue pixel electrode crosses the vertical line connecting a second red connection part of the second red pixel electrode, a second green connection part of the second green pixel electrode, and a second blue connection part of the second blue pixel electrode.

10. The display as claimed in claim 9, wherein:
the first red switch and the second red switch cross each other,
the first green switch and the second green switch cross each other, and
the first blue switch and the second blue switch cross each other.

11. The display as claimed in claim 7, wherein the red connection part, the green connection part, and the blue connection part are substantially on a same oblique line.

12. The display as claimed in claim 11, wherein the oblique line includes:
a first oblique line connects a first red connection part of the first red pixel electrode, a first green connection part of the first green pixel electrode, and a first blue connection part of the first blue pixel electrode,
a second oblique line connects a second red connection part of the second red pixel electrode, a second green connection part of the second green pixel electrode, and a second blue connection part of the second blue pixel electrode, and
the first oblique line is substantially parallel to the second oblique line.

13. The display as claimed in claim 12, wherein:
the first red switch is substantially parallel to the second red switch,
the first green switch is substantially parallel to the second green switch, and
the first blue switch is substantially parallel to the second blue switch.

14. The display as claimed in claim 7, wherein the pixel electrodes include:
a first dot electrode including the first red pixel electrode, the first green pixel electrode, and the first blue pixel electrode, and
a second dot electrode including the second red pixel electrode, the second green pixel electrode, and the second blue pixel electrode.

15. The display as claimed in claim 14, wherein:
the first red pixel electrode, the first green pixel electrode, and the first blue pixel electrode are sequentially disposed from a first side to a second side, and
the second red pixel electrode, the second green pixel electrode, and the second blue pixel electrode are sequentially disposed from a third side to a fourth side.

16. The display as claimed in claim 3, further comprising:
an encapsulation layer on the organic light emitting diodes; and
a scattering layer between the encapsulation layer and the polarization layer.

17. The display as claimed in claim 1, further comprising:
a plurality of the first dot openings; and
a plurality of the second dot openings alternatively disposed with the first dot openings.

18. The display as claimed in claim 1, wherein the light blocking layer has a first surface and a second surface, and wherein the color filters cover the second surface of the light blocking layer opposite to the first surface of the light blocking layer, the first surface of the light blocking layer facing the organic light emitting diodes, and wherein the first surface of the light blocking layer is coplanar with a surface of the color filters facing the organic light emitting diodes.

19. The display as claimed in claim 1, wherein the first red opening, the first green opening, and the first blue opening have widths narrower than those of corresponding organic light emitting diodes.

20. An organic light emitting diode display, comprising:
a first dot opening;
a second dot opening;
a plurality of color filters;
a plurality of organic light emitting diodes; and
a light blocking layer over the organic light emitting diodes,
wherein the light blocking layer includes a plurality of openings respectively corresponding to the organic light emitting diodes, wherein the color filters respectively fill the openings, wherein the first dot opening includes a first red opening, a first green opening, and a first blue opening elongated in a first direction, and wherein the second dot opening includes a second red opening, a second green opening, and a second blue opening elongated in a second direction crossing the first direction, wherein
the plurality of organic light emitting diodes emit red light, green light and blue light respectively, and wherein a resonance structure is disposed between the plurality of organic light emitting diodes and the plurality of color filters.

21. The display as claimed in claim 20, wherein the light blocking layer is to block light passing through the color filters and reflected from corresponding ones of the organic light emitting diodes.

22. The display as claimed in claim 20, further comprising:
a first dot color filter having a first red color filter, a first green color filter, and a first blue color filter respectively corresponding to the first red opening, the first green opening, and the first blue opening, and
a second dot color filter having a second red color filter, a second green color filter, and a second blue color filter respectively corresponding to the second red opening, the second green opening, and the second blue opening.

* * * * *